United States Patent [19]

Mehendale

[11] Patent Number: 5,502,402
[45] Date of Patent: Mar. 26, 1996

[54] FPGA ARCHITECTURE BASED ON A SINGLE CONFIGURABLE LOGIC MODULE

[75] Inventor: Mahesh M. Mehendale, Bangalore, Ind.

[73] Assignee: Texas Instruments Incorporated, Dallas, Tex.

[21] Appl. No.: 369,208

[22] Filed: Jan. 5, 1995

[51] Int. Cl.$^6$ .............................................. H03K 19/177
[52] U.S. Cl. ........................ 326/40; 326/39; 326/46
[58] Field of Search ........................... 326/38–39, 40–41, 326/44–45, 46–47; 327/217–218

[56] References Cited

U.S. PATENT DOCUMENTS

| | | | |
|---|---|---|---|
| 4,366,393 | 12/1982 | Kasuya | 326/16 |
| 5,155,389 | 10/1992 | Furtek | 326/39 |
| 5,298,803 | 3/1994 | Starkweather | 326/39 |
| 5,349,544 | 9/1994 | Wright et al. | 326/39 X |
| 5,414,376 | 5/1995 | Hawes | 326/40 |
| 5,440,247 | 8/1995 | Kaplinsky | 326/41 X |
| 5,444,394 | 8/1995 | Watson et al. | 326/41 X |

*Primary Examiner*—David R. Hudspeth
*Attorney, Agent, or Firm*—Peter T. Rutkowski; Richard L. Donaldson; William E. Hiller

[57] ABSTRACT

A logic module uses a multiplexer which can be used to configure the logic module as combinational or sequential. A sequential block comprises a flip-flop with preset and clear, and can be SR or D-type. The multiplexer is used in the feedback loop of the flip-flop, thus by choosing an appropriate select signal the feedback can be connected/disconnected.

4 Claims, 1 Drawing Sheet

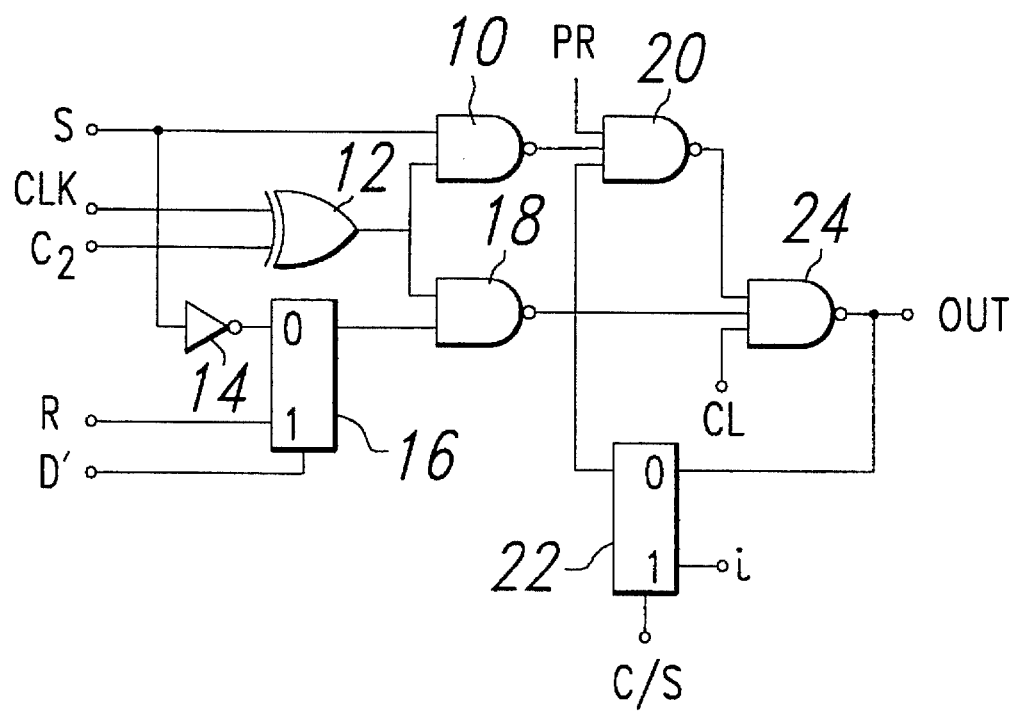

FPGA ARCHITECTURE BASED ON A SINGLE CONFIGURABLE LOGIC MODULE

FIELD OF THE INVENTION

The present invention relates to a Field Programmable Gate Array (FPGA) architecture and more particularly to an FPGA architecture wherein a single configurable logic module may be configured for either combinational or sequential logic functions.

BACKGROUND OF THE INVENTION

In certain prior art FPGA architectures, such as ACTEL 1010 (manufactured by ACTEL Corporation of Sunnyvale, Calif.), 2 logic modules are required to implement a flip-flop. This affects performance and gate utilization. In the ACTEL-1280 type of architectures, there are dedicated sequential blocks, flip-flops as part of the logic module. These flip-flops are uniformly distributed over the array, e.g. a typical array would have 400 combinational and 200 sequential logic modules. This limits the number of sequential blocks and combinational blocks that can be mapped, e.g. a design needing 300 combinational and 300 sequential elements cannot be mapped onto such an architecture. Also, a design with 500 combinational and 100 sequential blocks cannot be mapped onto such an architecture. Since the locations of sequential blocks is fixed on the array, it restricts the placement and routing efficiency. Instead if a free distribution positioning of sequential modules is allowed, it can give better layout optimization.

Therefore, it is an object of the present invention to provide an FPGA architecture wherein the sequential blocks are not dedicated on the array;

It is a another object of the present invention to provide an FPGA architecture wherein there is greater flexibility in mapping of combinational and sequential blocks.

It is a further object of the present invention to provide an FPGA architecture based on a single configureble logic module which can be configured to perform combinational or sequential functions.

These and other objects of the invention will become apparent to those of ordinary skill in the art having reference to the following specification, in conjunction with the drawings.

SUMMARY OF THE INVENTION

In one aspect of the present invention a logic module uses a multiplexer which can be used to configure a logic module as combinational or sequential. A sequential block comprises a flip-flop with preset and clear, and can be SR or D-type. The multiplexer is used in a feedback loop of the flip-flop, thus by choosing an appropriate select signal the feedback can be connected/disconnected.

BRIEF DESCRIPTION OF THE DRAWINGS

FIGURE 1 is an FPGA architecture for the logic module of the preferred embodiment.

DETAILED DESCRIPTION OF THE PREFERRED EMBODIMENT

The FPGA logic module of the preferred embodiment is shown in FIGURE 1. A first NAND gate 10 receives a signal S at its first input. The signal S is also coupled to the input of an inverter 14. The output of the inverter 14 is coupled to a first input of a first multiplexer 16. A signal R is coupled to a second input of the multiplexer 16 and a signal D' is coupled to the select input of the multiplexer 16. CLK and $C_2$ signals are coupled to first and second inputs of an EXCLUSIVE OR gate 12 and the output of gate 12 is coupled to both a second input to NAND gate 10 and a first input of second NAND gate 18. An output of first multiplexer 16 is coupled to a second input to NAND gate 18. A third NAND gate 20 has a signal PR coupled to its first input and an output of NAND gate 10 coupled to its second input. A fourth NAND gate 24 has a first input which is coupled to the output of NAND gate 20, a second input which is coupled to the output of NAND gate 18 and a signal C1 coupled to its third input. The output of NAND gate 24 is coupled to a first input of a second multiplexer 22. The multiplexer 22 also has a signal i coupled to its second input and a c/s signal coupled to its select input. The output of multiplexer 22 is connected to a third input of NAND gate 20. The output of the logic module is the output of fourth NAND gate 24.

The logic module operates as follows: when c/s is 0, the feedback loop is connected, to get cross-coupled NAND gates forming a flip-flop. PR and CL signals provide preset and clear for the flip-flop. D' is used to configure the flip-flop as D type(D'=0) or SR type(D'=1). $C_2$ is used to invert/non-invert the clk(clock) signal. When $c_2=1$, clk is inverted. When $c_2=0$, the clk is not inverted. This is useful in case of a master-slave configuration, where the clk to the 'slave' stage is inverted. When c/s=1, the feedback loop is broken, and the logic module implements an 8-input combinational function:

$$out=f(S, clk, C_2, R, D', PR, CL, i);$$

In the FPGA logic module of FIGURE 1, the input signals S and R were labeled as such because they represent S and R inputs of an SR-flipflop when the logic module is configured as an SR-flipflop. Similarly, input 'i' represents an input to the logic module when it is configured to provide combinational functions. However, the inputs may be labeled $in_1-in_9$ to avoid confusion.

Below in Table 1, is a comparison of functions that can be implemented with the ACTEL 1010 and 1280 architectures and the logic module architecture of the present invention. These numbers represent the number of unique macros with 1 through 8 inputs.

TABLE 1

| No. of inputs | 1 | 2 | 3 | 4 | 5 | 6 | 7 | 8 | total |
|---|---|---|---|---|---|---|---|---|---|
| Actel-1010 | 2 | 8 | 47 | 210 | 285 | 138 | 21 | 1 | 702 |
| Actel-1280 | 2 | 8 | 48 | 238 | 319 | 130 | 20 | 1 | 766 |
| New logic Module | 3 | 9 | 44 | 181 | 231 | 106 | 17 | 1 | 590 |

The corresponding macrolibraries were used to synthesize 6 MCNC PLA benchmarks. The MIS tool was used and synthesis was done using area-time bias of 0.1(0–area, 1–timing). The results obtained in Table 2 below are merely representative and were obtained during experimentation. The results may be different based on the tool used and the optimization/mapping algorithms used.

TABLE 2

| Benchmark PLAs | # i/p | # o/p | # product terms | 1010 lib. w/99 macros | 1280 lib. w/148 mac. | new log. Mod. lib. w/94 mac. |
|---|---|---|---|---|---|---|
| bw | 5 | 28 | 87 | 92 | 75 | 86 |
| duke2 | 22 | 29 | 87 | 210 | 191 | 210 |
| misex3c | 14 | 14 | 197 | 263 | 268 | 274 |
| vg2 | 25 | 8 | 110 | 40 | 43 | 46 |
| misex2 | 25 | 18 | 29 | 50 | 46 | 56 |
| misex3 | 14 | 14 | 1848 | 936 | 948 | 959 |

As can be seen, the results for the novel logic module of the present invention are comparable with the Actel 1010 and 1280 architectures. In addition, the logic module architecture of the present invention provides unlimited combinational/sequential mix. Also, place and route flexibility is greatly enhanced.

In conclusion, the above described invention is an FPGA architecture based on a single configurable logic module, for both combinational and sequential functions. This is different from prior art architectures which have dedicated sequential elements at fixed locations on the array. Unlike these prior art architectures, the new architecture allows an unlimited mix of combinatorial and sequential elements. Since the sequential elements can be placed at any location, it gives much more flexibility for place and route. In some of the existing architectures such as Actel-1280, the sequential part of the logic module is wasted, when it is used as a combinational only element. This wastage is avoided in the proposed architecture of the present invention. The common logic module is built around cross-coupled NAND gates to provide efficient sequential logic implementation. The logic module can be reconfigured to provide efficient sequential logic implementation. The logic module can also be reconfigured for combinational functions, via a multiplexor which breaks the feedback loop.

Although the invention has been described in detail herein with reference to its preferred embodiment, it is to be understood that this description is by way of example only, and understood that numerous changes in the details of the invention, will be apparent to, and may be made by persons of ordinary skill in the art having reference to this description. It is contemplated that such changes and additional embodiments are within the spirit and true scope of the invention as claimed below.

I claim:

1. A configurable logic module, which can be configured as combinational or sequential, comprises:

a combinational logic block;

a sequential logic block;

a plurality of inputs are coupled to the combinational logic block and outputs from the combinational logic block are coupled to the sequential logic block;

said sequential logic block comprises cross-coupled NAND gates acting as a flip-flop, and a multiplexer in the feedback path from the output of one cross-coupled NAND gate to the input of the other cross-coupled NAND gate, thus by choosing an appropriate select signal for the multiplexer, the feedback can be connected wherein the cross-coupled NAND gates form a flip-flop for performing sequential logic or if the feedback is disconnected wherein the logic module implements a combinational function.

2. The configurable logic module of claim 1 wherein said flip-flop is an SR-type flip-flop.

3. The configurable logic module of claim 1 wherein said flip-flop is a D-type flip-flop.

4. A configurable logic module comprises:

a first NAND gate which receives a signal S at its first input;

an inverter which receives a signal S at its input;

a first multiplexer having a first input coupled to the output of said inverter, having a second input coupled to a signal R, and a signal D' is coupled to a select input of said first multiplexer;

an EXCLUSIVE OR gate has signals CLK and $C_2$ coupled to its first and second inputs, and its output is coupled to a second input of said first NAND gate;

a second NAND gate has first and second inputs coupled to the output of said EXCLUSIVE OR gate and the output of said first multiplexer;

a third NAND gate has a signal PR coupled to its first input and an output of NAND gate coupled to its second input;

a fourth NAND gate has a first input which is coupled to the output of said third NAND gate, a second input which is coupled to the output of said second NAND gate and a signal C1 coupled to its third input; and a second multiplexer has a first input coupled to said output of said fourth NAND gate and a signal i coupled to its second input and a c/s signal coupled to its select input, and an output of said second multiplexer is connected to a third input of said third NAND gate.

* * * * *